United States Patent
Parks

(12) 
(10) Patent No.: US 7,012,646 B2
(45) Date of Patent: Mar. 14, 2006

(54) RESET DRIVER CIRCUIT DISPOSED ON THE SAME SUBSTRATE AS THE IMAGE SENSOR

(75) Inventor: Christopher Parks, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 714 days.

(21) Appl. No.: 10/116,478

(22) Filed: Apr. 4, 2002

(65) Prior Publication Data

US 2003/0189659 A1    Oct. 9, 2003

(51) Int. Cl.
H04N 3/14 (2006.01)
H04N 5/335 (2006.01)

(52) U.S. Cl. ............ 348/312; 348/294; 257/258; 257/291

(58) Field of Classification Search ........ 348/311–312, 348/294; 257/258, 291
See application file for complete search history.

(56) References Cited

U.S. PATENT DOCUMENTS

| | | | | |
|---|---|---|---|---|
| 4,031,315 A | * | 6/1977 | Pfleiderer | 348/311 |
| 4,831,460 A | * | 5/1989 | Yamada | 348/311 |
| 5,748,340 A | * | 5/1998 | Shimizu | 358/482 |
| 5,818,075 A | * | 10/1998 | Kawamoto et al. | 257/239 |
| 5,982,428 A | * | 11/1999 | Charneski et al. | 348/312 |
| 2002/0067416 A1 | * | 6/2002 | Yoneda et al. | 348/304 |

OTHER PUBLICATIONS

Ackland, B. et al., "Camera on a chip," Feb., 8-10, 1996, Solid-State Circuits Conference, 1996. Digest of Technical Papers. 43rd ISSCC., 1996 IEEE International, page(s):22-25, 412.*

* cited by examiner

Primary Examiner—Ngoc-Yen Vu
Assistant Examiner—Carramah J. Quiett
(74) Attorney, Agent, or Firm—Peyton C. Watkins

(57) ABSTRACT

A charge-coupled device for forming an electronic representation of an image from incident light, the charge-coupled device includes a substrate of a first type; a photosensitive area of a second type disposed in the substrate for receiving the incident light which is converted to a charge packet; a transfer mechanism for activating transfer of the charge packet through the charge-coupled device; an output mechanism for receiving the transferred charge packet; a reset operator for resetting the output mechanism to a charge voltage; and a logical element disposed on the substrate that inputs a gate waveform to the reset operator for activating the resetting operation of the reset operator.

2 Claims, 6 Drawing Sheets

RESET DRIVER CIRCUIT DISPOSED ON THE SAME SUBSTRATE AS THE IMAGE SENSOR

FIELD OF THE INVENTION

The invention relates generally to the field of reset driver circuits for image sensors and, more particularly, to such sensors having the reset driver circuit on the same substrate as the image sensor for eliminating undesired resistance, capacitance, and inductance.

BACKGROUND OF THE INVENTION

Referring to FIGS. 1 and 2, there is shown an image sensor of the prior art having a n-type buried channel 10 built into a p-type well 20. The buried channel 10 is covered by CCD gates 30 of either the 2,3, or four-based architecture (the two-phase architecture is shown here). The last clocked CCD gate 30b is isolated from the n-type floating diffusion amplifier input 40 by an output gate 50 which is not clocked. The floating diffusion 40 is periodically reset to a reference voltage level by a reset gate 60 forming an NMOS transistor between the floating diffusion 40 and the reset drain 70.

Referring to FIG. 3, there is shown a timing sequence for the image sensor of FIG. 1 for converting a charge packet of electrons from the CCD to a measurable voltage. At times T0, the reset gate 60 is clocked high. This turns on the reset transistor and resets the floating diffusion 40 to the reset drain reference voltage. Then at time T1, the reset gate 60 is clocked low. Capacitive coupling between the reset gate 60 and the floating diffusion 40 causes the floating diffusion voltage 40 to be pushed to a more negative voltage when the reset gate 60 is turned off. The floating diffusion 40 voltage then remains stable and is sampled at time T2. Then at time T3, the CCD clocks 30a and 30b changes levels and transfers a new charge packet over the output gate 50 and onto the floating diffusion 40. The magnitude of the voltage change at time T3 on the floating diffusion 40 is proportional to the size of the charge packet and floating diffusion capacitance. The new voltage on the floating diffusion 40 is sampled at time T4, and then the timing cycle is repeated.

Although the presently known and utilized CCD is satisfactory, it includes drawbacks. The shortcoming of this CCD output sensing structure is that the reset clock pulse is generated external to the image sensor. Therefore, the reset clock must travel through the image sensor input, bonding wire, and metal wiring before reaching the reset gate. At higher frequencies, for example frequencies greater than 30 MHz, the path from the reset clock driver to the reset gate has substantial capacitance, resistance and inductance which degrades the shape of the reset pulse as shown in FIG. 4.

SUMMARY OF THE INVENTION

The present invention is directed to overcoming one or more of the problems set forth above. Briefly summarized, according to one aspect of the present invention, the invention resides in a charge-coupled device for forming an electronic representation of an image from incident light, the charge-coupled device comprising (a) a substrate of a first type; (b) a photosensitive area of a second type disposed in the substrate for receiving the incident light which is converted to a charge packet; (c) a transfer mechanism for activating transfer of the charge packet through the buried channel; (d) an output mechanism for receiving the transferred charge packet; (e) a reset operator for resetting the output mechanism to a voltage level; and (f) a logical element disposed on the substrate that inputs a gate waveform to the reset operator for activating the resetting operation of the reset operator.

The above and other objects of the present invention will become more apparent when taken in conjunction with the following description and drawings wherein identical reference numerals have been used, where possible, to designate identical elements that are common to the figures.

Advantageous Effect of the Invention

The present invention has the following advantages of substantially eliminating a degraded reset clock signal by eliminating undesirable capacitance, resistance and inductance.

DETAILED DESCRIPTION OF THE INVENTION

Figure 1:
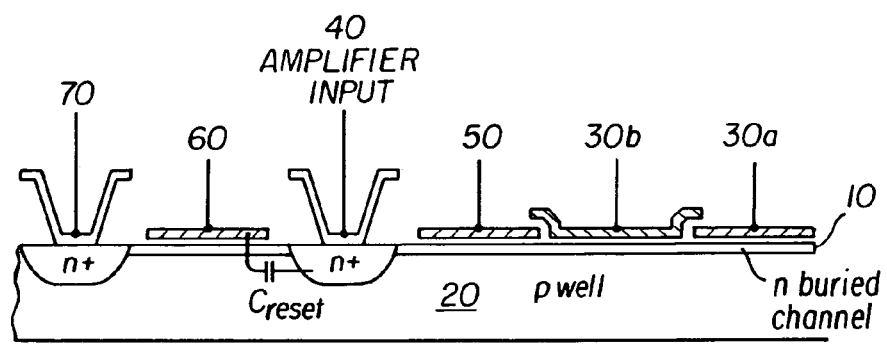
FIG. 1 is a side view in horizontal cross section of a prior art image sensor.
Figure 2:
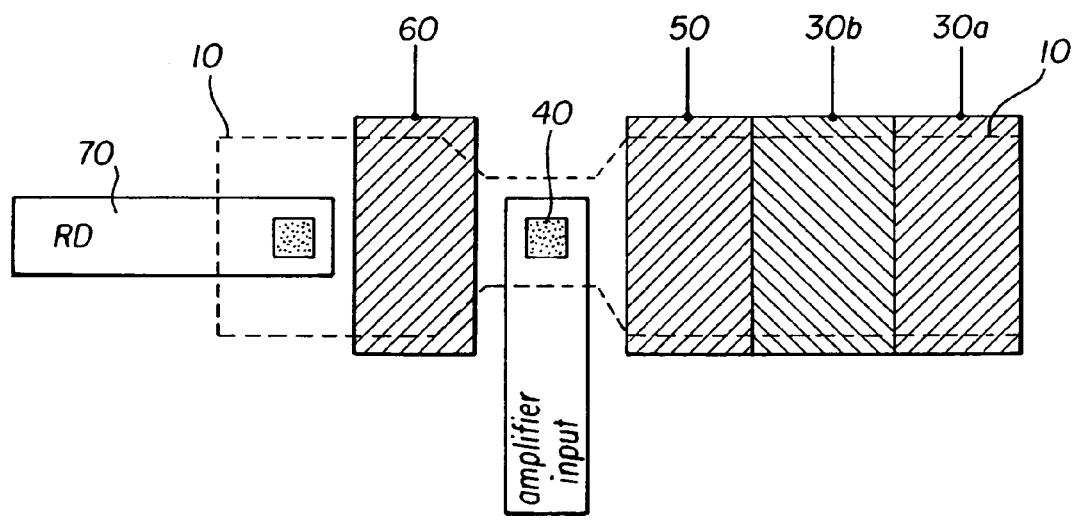
FIG. 2 is a top view of FIG. 1.
Figure 3:
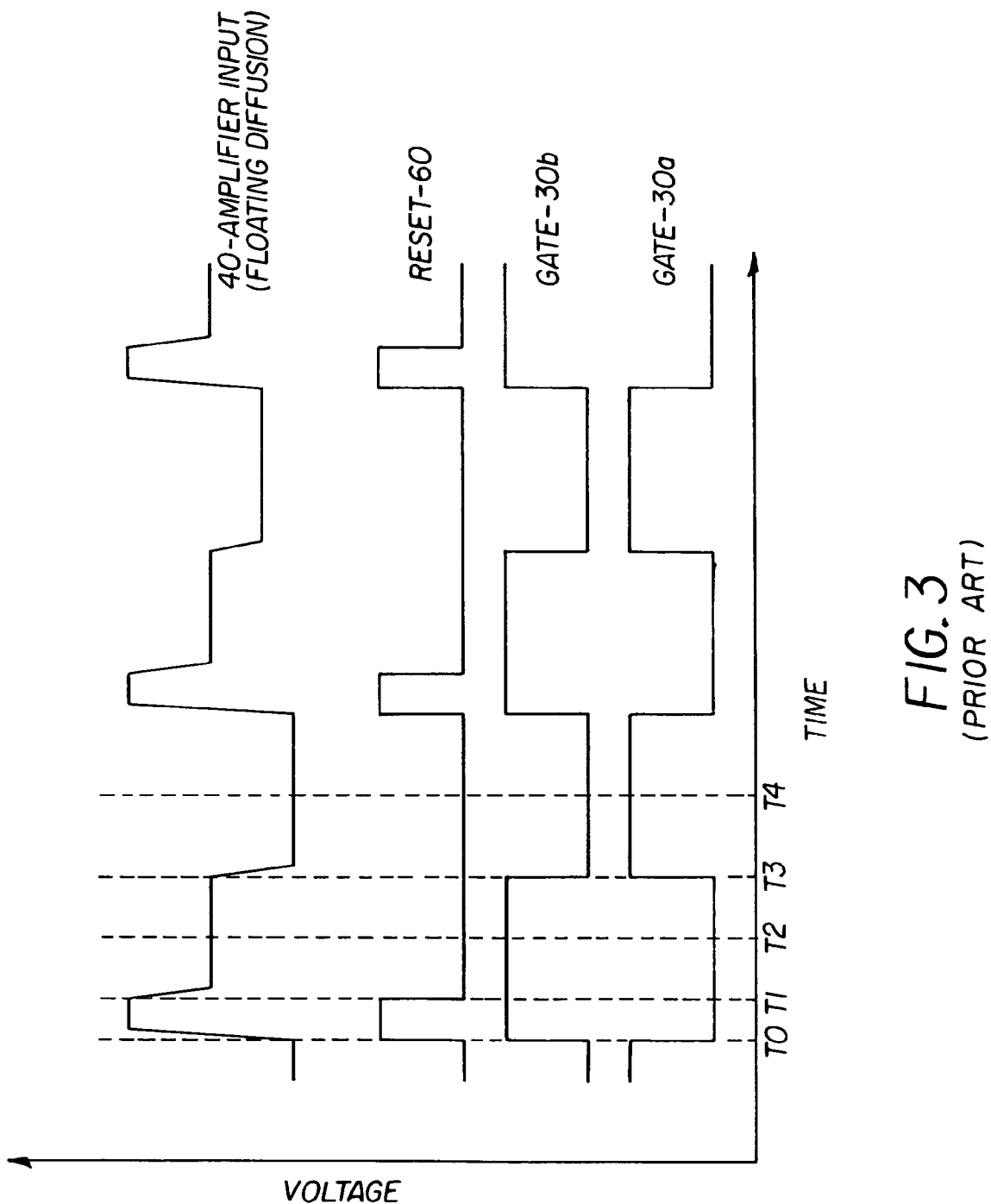
FIG. 3 is a timing diagram for the sensor of FIG. 1.
Figure 4:
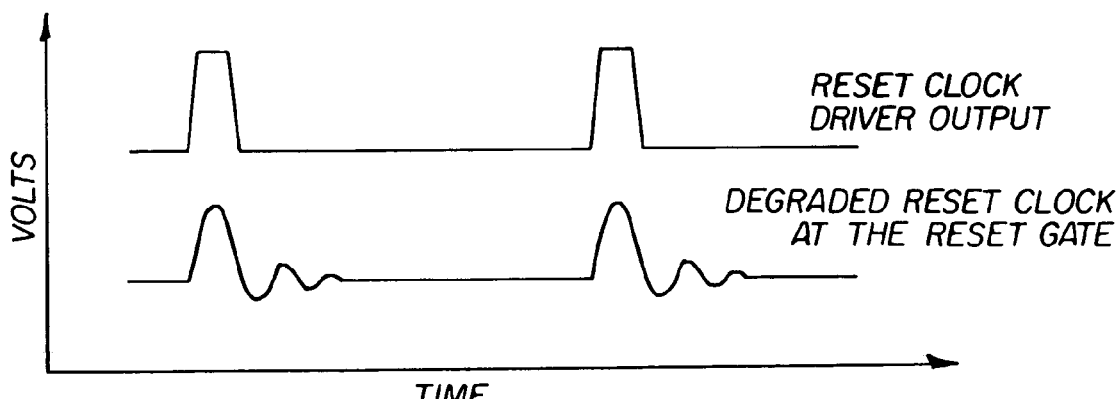
FIG. 4 is a graph of the reset clock signal at the reset gate of the image sensor of FIG. 1.
Figure 5:
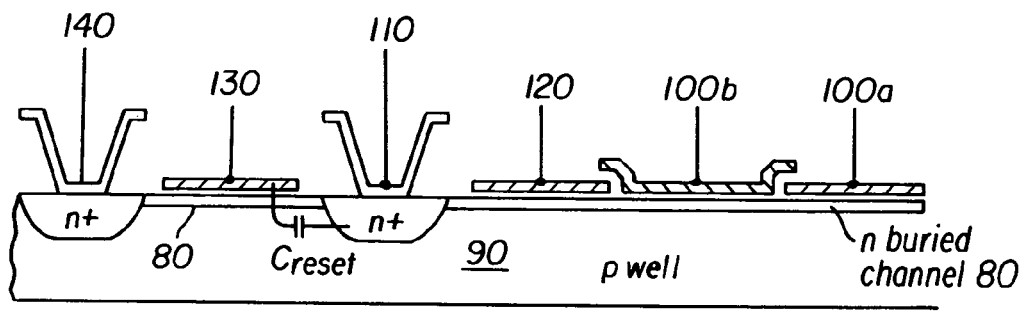
FIG. 5 is a side view in horizontal cross section of the image sensor of the present invention.

Referring to FIG. 5, there is shown an image sensor of the present invention having a n-type buried channel 80 built into a p-type well (substrate) 90. The buried channel 80 is covered by CCD gates 100 of either the 2,3, or four-based architecture (the two-phase architecture is shown here). The last clocked CCD gate 100b is isolated from the n-type floating diffusion amplifier input 110 by an output gate 120 which is not clocked. The floating diffusion 110 is periodically reset to a reference voltage level by a reset gate 130 that receives a signal from an integrated clock driver (described in detail hereinbelow), which reset gate 130 forms an NMOS transistor between the floating diffusion 110 and the reset drain 140.

Figure 6:
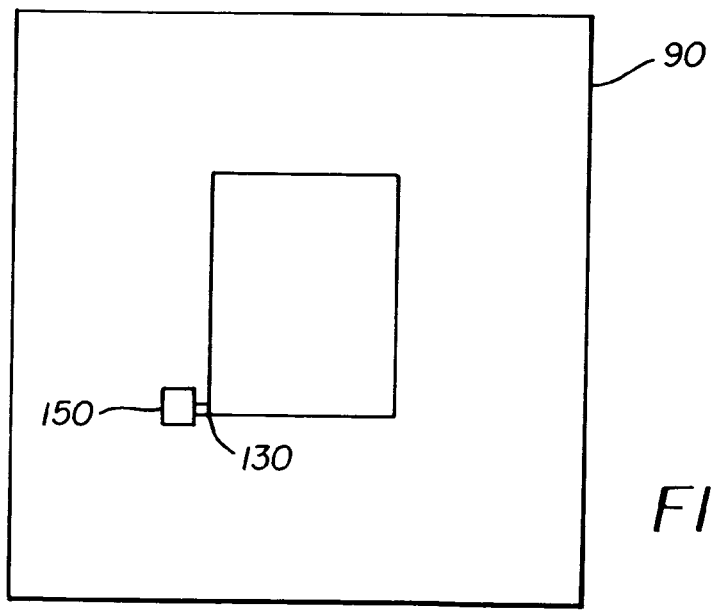
FIG. 6 is a drawing in top view of the image sensor of FIG. 5.

Referring to FIG. 6, there is shown a logical element 150 formed integrally on the substrate 90 and adjacent and electrically connected to the reset gate 130, which logical element 150 is also referred to as an integrated reset clock driver 150. This integrated reset clock driver 150, described in detail hereinbelow, supplies a short pulse for resetting the transistor. The advantage is a very short pulse generated in close proximity to the reset transistor. By minimizing the distance between the reset pulse generator circuit and the reset transistor, the parasitic resistance, capacitance and inductance is reduced to a minimum. This permits the non-degradation of the waveform as in the prior art.

Figure 7:
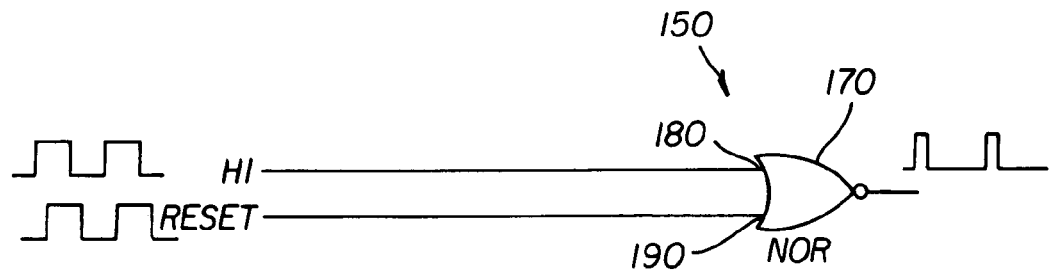
FIG. 7 is a detailed drawing of the integrated reset circuit of the present invention.
Figure 8:
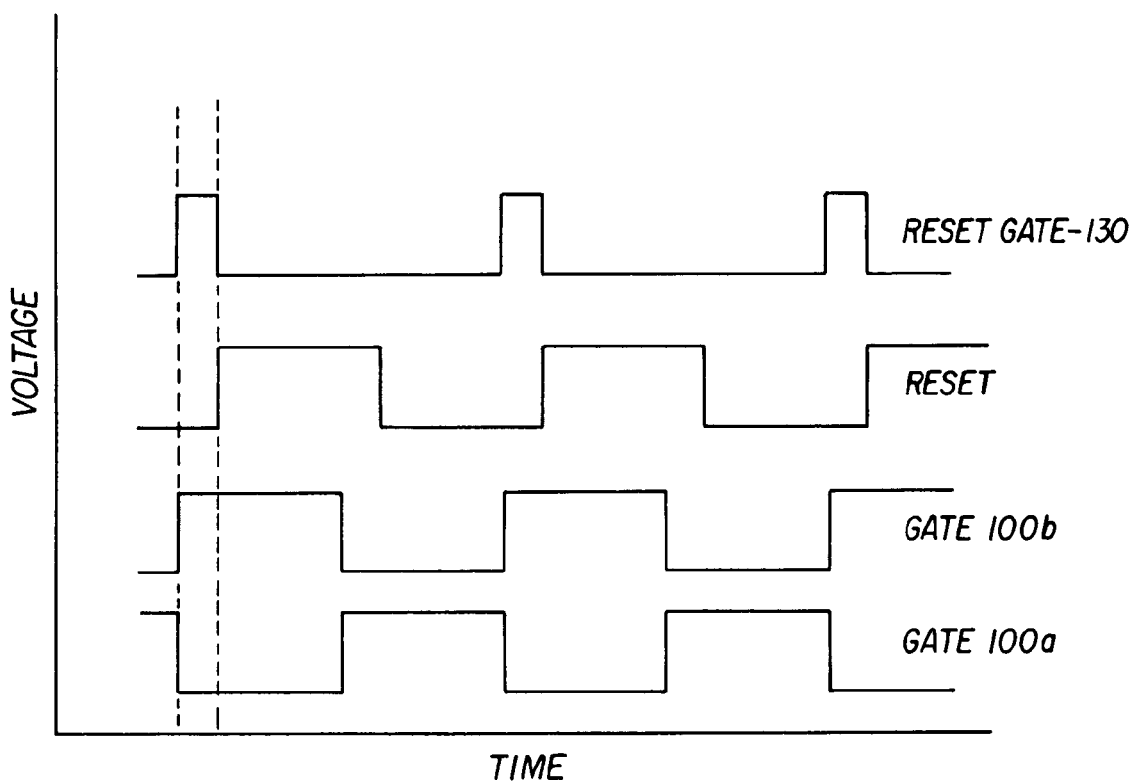
FIG. 8 is a timing diagram of the circuit of FIG. 7.

Referring to FIGS. 7 and 8, there is shown a detailed drawing of the integrated reset clock driver 150 on the substrate 90. The integrated reset clock driver 150 includes a NOR gate 170 having two inputs 180 and 190 one of which 180 receives the gate 100a clock pulse, and the other 190 which receives a square wave delayed in time from the gate 100b CCD clock pulse. The integrated clock driver 150 combines the delayed reset input square wave with the gate 100a clock using the equivalent of the logical NOR function to generate the reset gate waveform output signal as illustrated in FIG. 8.

Figure 9:
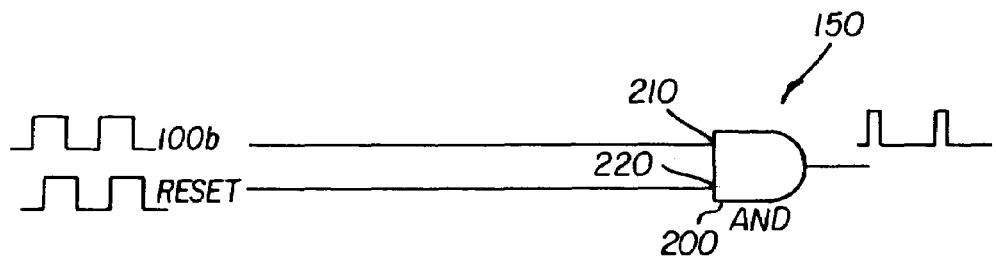
FIG. 9 is a detailed drawing of an alternative embodiment of FIG. 7.
Figure 10:
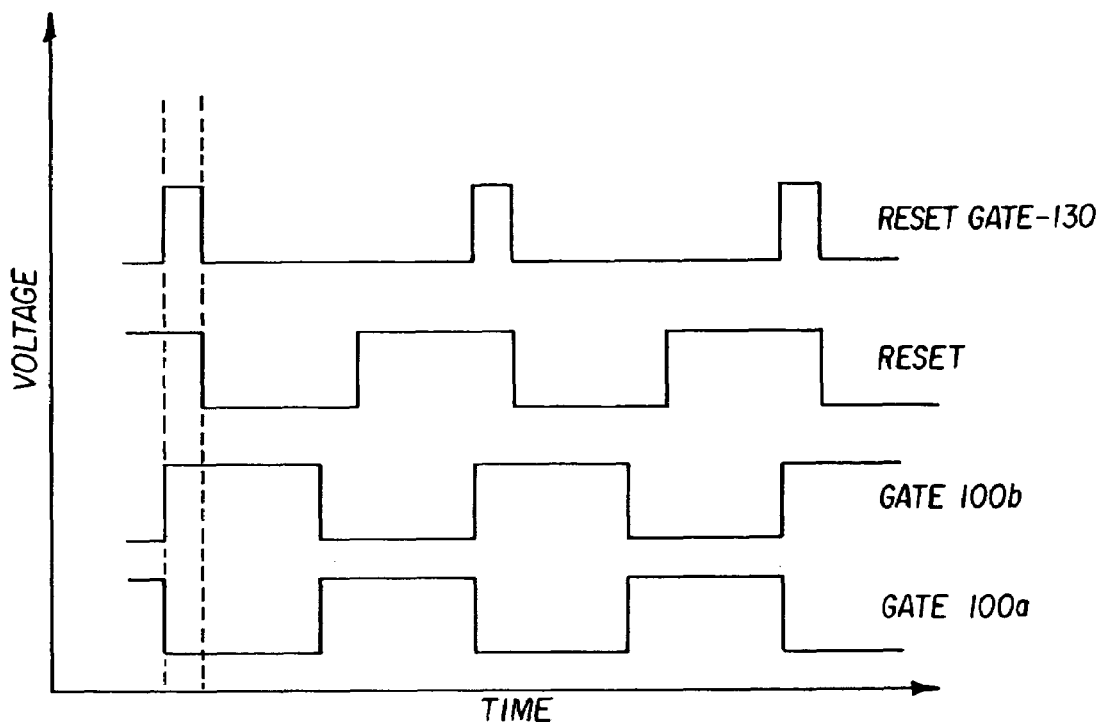
FIG. 10 is a timing diagram of the circuit of FIG. 9.

Referring to FIGS. 9 and 10, there is shown an alternative embodiment of FIG. 7. The alternative embodiment of the integrated reset driver 150 on the substrate 90 includes an AND gate 200 having two inputs 210 and 220 one of which 210 receives the gate 100b clock pulse, and the other 220 which receives a square wave delayed in time from the gate 100b CCD clock pulse. The integrated clock driver 150 combines the delayed reset input square wave with the gate 100b clock using the equivalent of the logical AND function to generate the reset gate waveform as illustrated in FIG. 10.

Figure 11:
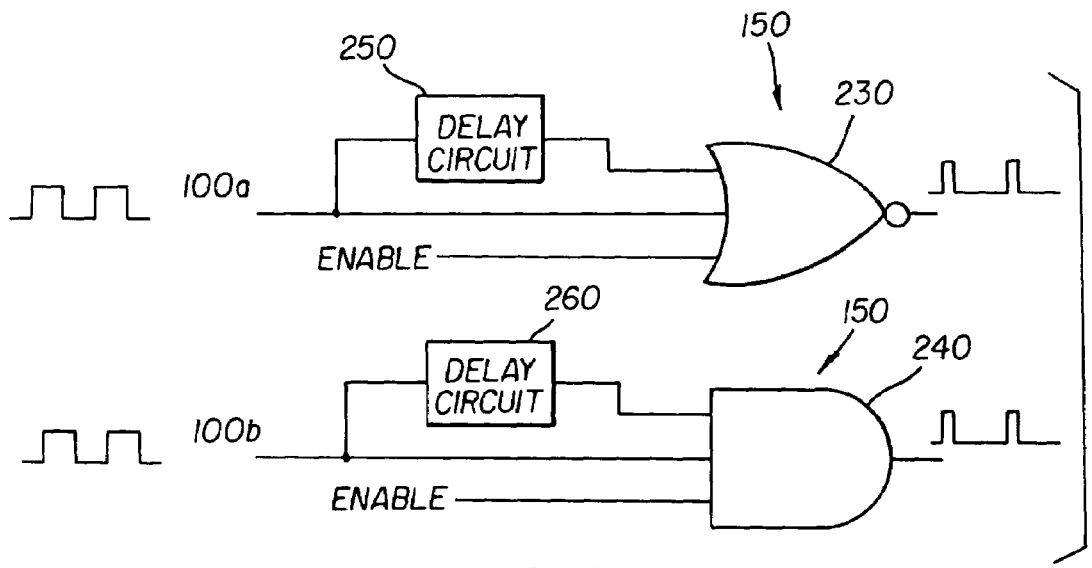
FIG. 11 is a another detailed drawing of an alternative embodiment of FIG. 7.
Figure 12:
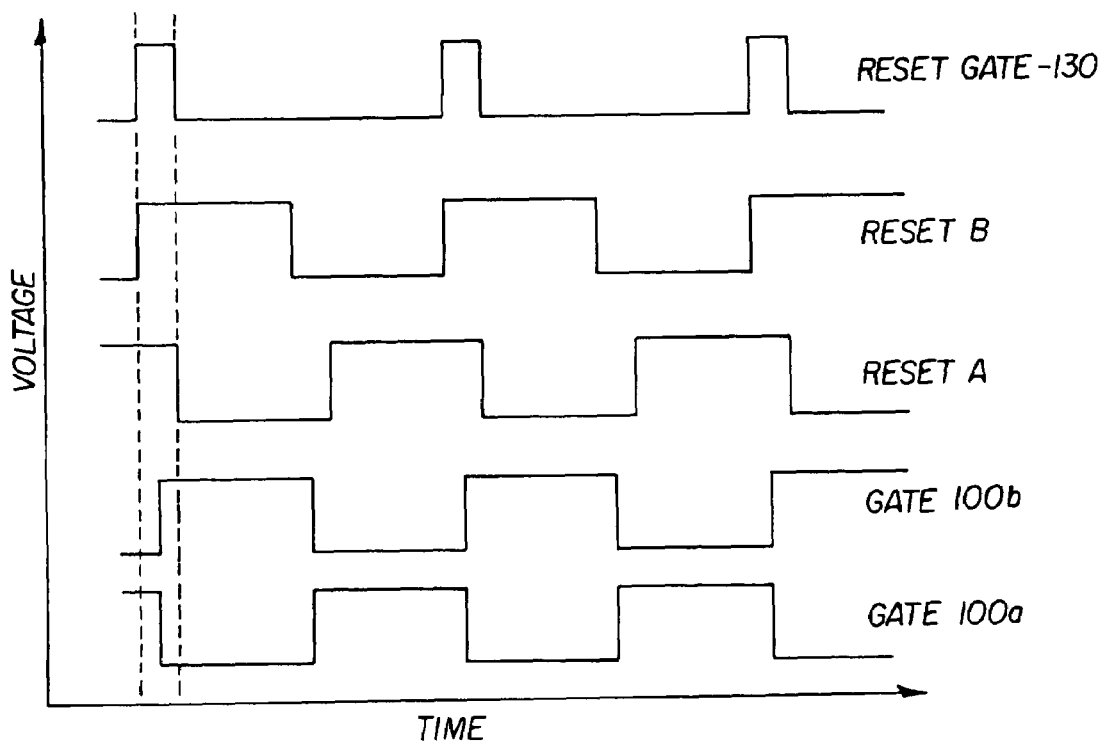
FIG. 12 is a timing diagram the circuit of FIG. 11.

Referring to FIGS. 11 and 12, there are shown still further two alternative embodiments which do not require timing circuits for the reset clock. The integrated reset clock 150 on the substrate 90 uses one of the CCD clocks (either 100a or 100b) to create a second delayed copy of the same CCD clock which is re-combined with itself using a logical NOR or AND function to create a short reset gate pulse. An ENABLE input enables both gates, as is well known in the art. More specifically, the NOR gate 230 uses the gate 100a signal and a delayed gate 100a signal from a delay circuit 250 to produce the output signal, and the AND gate 240 uses the gate 100b signal and a delayed 100b signal from a delay circuit 260 to produce the output signal. It is instructive to note that the delay circuits 250 and 260 are also on the substrate 90.

The invention has been described with reference to a preferred embodiment. However, it will be appreciated that variations and modifications can be effected by a person of ordinary skill in the art without departing from the scope of the invention.

PARTS LIST 10 buried channel
20 well
30 gates
40 amplifier input (floating diffusion)
50 gate
60 reset gate
70 reset drain
80 buried channel
90 substrate (well)
100 gates
110 amplifier input (floating diffusion)
120 gate
130 reset gate
140 reset drain
150 logical element (integrated reset clock driver)
170 NOR gate
180 input
190 input
200 AND gate
210 input
220 input
230 NOR Gate
240 AND gate
250 delay circuit
260 delay circuit

What is claimed is:

1. A charge-coupled device for forming an electronic representation of an image from incident light, the charge-coupled device comprising:
  (a) a substrate of a first type;
  (b) a photosensitive area of a second type disposed in the substrate for receiving the incident light that is converted to a charge packet;
  (c) a transfer mechanism for activating transfer of the charge packet through the charge-coupled device;
  (d) an output mechanism for receiving the transferred charge packet;
  (e) a reset operator for resetting the output mechanism to a charge voltage;
  (f) a NOR gate disposed on the substrate that inputs a gate waveform to the reset operator for activating the resetting operation of the reset; and
  (g) a first input to the NOR gate which receives a clocking substantially equal to a clocking for the transfer mechanism for forming a first clocking, and a second input which receives a time-delayed first clocking from a time-delay circuit that is on the substrate.

2. A digital camera for capturing an image, the digital camera comprising:
  (a) a charge-coupled device a for forming an electronic representation of an image from incident light comprising:
  (b) a substrate of a first type;
  (c) a photosensitive area of a second type disposed in the substrate for receiving the incident light that is converted to a charge packet,
  (d) a transfer mechanism for activating transfer of the charge packet through the charge-coupled device;
  (e) an output mechanism for receiving the transferred charge packet;
  (f) a reset operator for resetting the output mechanism to a charge level;
  (g) a NOR gate disposed on the substrate that inputs a gate waveform to the reset operator for activating the resetting operation of the reset operator and
  (h) a first input to the NOR gate which receives a clocking substantially equal to a clocking for the transfer mechanism for forming a first clocking and a second input which receives a time-delayed first clocking from a time-delay circuit that is on the substrate.

* * * * *

UNITED STATES PATENT AND TRADEMARK OFFICE
CERTIFICATE OF CORRECTION

PATENT NO. : 7,012,646 B2 Page 1 of 1
APPLICATION NO. : 10/116478
DATED : March 14, 2006
INVENTOR(S) : Christopher Parks It is certified that error appears in the above-identified patent and that said Letters Patent is hereby corrected as shown below:

Column 4, line 28, insert the word --operator-- between "reset" and "; and".

Signed and Sealed this

Eleventh Day of July, 2006

JON W. DUDAS
*Director of the United States Patent and Trademark Office*